Figure 1:
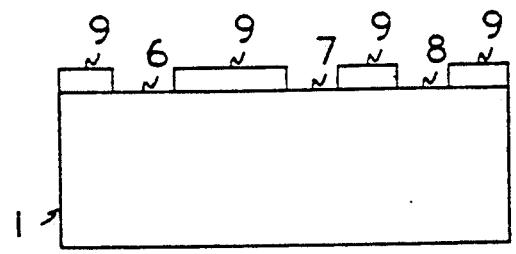

United States Patent [19]

Boucquet

[11] Patent Number: 5,042,145

[45] Date of Patent: Aug. 27, 1991

[54] METHOD FOR MOUNTING AN ELECTRONIC COMPONENT AND MEMORY CARD USING SAME

[75] Inventor: Jan P. Boucquet, Roeselare, Belgium

[73] Assignee: Alcatel N.V., Amsterdam, Netherlands

[21] Appl. No.: 446,529

[22] Filed: Dec. 6, 1989

[51] Int. Cl.⁵ .............................................. H05K 3/34
[52] U.S. Cl. .................... 29/840; 174/52.4; 228/180.2; 361/401
[58] Field of Search ................. 29/832, 837–843; 174/52.4, 52.2; 228/123, 180.2; 361/401; 357/75

[56] References Cited

U.S. PATENT DOCUMENTS

| | | | |
|---|---|---|---|
| 3,908,075 | 9/1975 | Jackson et al. | 361/401 |
| 4,237,607 | 12/1980 | Ohno | 29/841 |
| 4,746,392 | 5/1988 | Hoppe | 29/841 |
| 4,774,633 | 9/1988 | Dehaine et al. | 361/398 |
| 4,941,257 | 7/1990 | Gloton | 29/840 |

FOREIGN PATENT DOCUMENTS

| | | |
|---|---|---|
| 0207852 | 1/1987 | European Pat. Off. |
| 0246744 | 11/1987 | European Pat. Off. |
| 2601477 | 1/1988 | France |
| 31673 | 3/1977 | Japan ................... 29/841 |

OTHER PUBLICATIONS

Mechanically Controlled Thermal Joining, IBM Tech. Discl. Bull. vol. 32, No. 84 Jan. 1990 p. 164.
M. Ohuchi et al., "A New LSI Interconnection Method for IC Card"; 2nd IEE International Electronics Manufacturing Technology Symposium pp. 30–33 (San Francisco 1986).
R. Nowicki, "Studies of the Ti–W/Au Metallization on Aluminum", *International Conference on Metallurgical Coatings,* San Francisco, Apr. 1978, pp. 195–205.

Primary Examiner—P. W. Echols
Attorney, Agent, or Firm—Christie, Parker & Hale

[57] ABSTRACT

A method for mounting a LSI chip (1) with conductive bumps (2, 3, 4) as terminals into a hole (15) of a card (5) and for interconnecting them. The card and therefore one end of the hole is first covered by a layer (16) of a conductive material. Then the conductive bumps of the chip placed in the hole are soldered to the layer while being pressed against this layer. Thus protrusions (17, 18, 19) are created on the external surface of the layer. These protrusions are ussed to facilitate the alignment of the mask used during the subsequent etching operation of the layer.

The invention also concerns a process for creating the conductive bumps (2, 3, 4) on the terminal pads (6, 7, 8) of the LSI chip (1).

7 Claims, 2 Drawing Sheets

METHOD FOR MOUNTING AN ELECTRONIC COMPONENT AND MEMORY CARD USING SAME

The present invention relates to a method for mounting an electronic component into a card and for interconnecting them, said electronic component being provided with at least one conductive bump constituting a terminal thereof, said method including the steps of mounting said component into a hole of said card and of interconnecting said conductive bump and a conductive portion of said card.

Such a method can be applied to the manufacture of "credit" cards and is already known from the articles "A NEW LSI INTERCONNECTION METHOD FOR IC CARD" by M. Ohuchi et al, published at the occassion of the "2nd IEEE International Electronics Manufacturing Technology Symposium", Sept. 15-17, 1986— San Francisco, pages 30 to 33. Interconnection mehods such a the Printed Wiring Connection (PWC), as well as more conventional methods such as the wire bonding method an Tape Automated Bonding (TAB) method are described in this article.

The wire bonding method provides a high bonding flexibility but requires two wire bonding operations: a first one to connect one end of a wire with the conductive bump and a second one to connect the other end of the wire with the conductive portion of the card. This wire as well as the bonds themselves constitute unwanted conduction resistances. Moreover, it is not easy to realize a relatively flat interconnection and to obtain plastic memory cards of hte "credit" type realized according to the International Standards Organization (ISO) recommendations, i.e. having a small height.

The Tape Automated Bonding (TAB) method allows the realization of an interconnection which is flatter and has a lower conduction resistance. However it has the drawback of requiring a relatively large area on the card near the hole to realize this interconnection.

The Printed Wiring Connection (PWC) method consists in successively mounting the electronic component, more particularly a Large Scale Integrated (LSI) chip, into the hole, embedding this chip in the hole, and realizing the interconnections by screen printing a pattern of conductive polymeric paste on the card through a mask. This method has several advantages since the interconnection realized has a small height and a low conduction resistance, but a drawback thereof is that the position of the chip in the hole and more particularly of each conductive bump thereof is not accurately known so that correctly positioning the mask for screen printing is a problem.

An object of the present invention is to provide a method which has the last mentioned advantages and moreover accurately positions the conductive bump in the hole.

According to the invention, this object is achieved due to the fact that prior to mounting said component into said hole, one end of the hole and at least that part of said card surrounding the hole are covered by a layer of a conductive material, after which said conductive bump is brought into contact with said layer during said mounting step.

Another characteristic feature of the present method is that after having been brought into contact with said conductive layer, said conductive bump is soldered to said conductive layer by heating either said conductive layer, said electronic component, or both.

Still another characteristic feature of the present method is that said electronic component and said conductive layer are pressed against each other during said soldering operation.

In this way a convex bump or protrusion is created on the external surface of the conductive layer at a positive corresponding to that of the conductive bump of the electronic component so that the position of this bump is accurately known thus facilitating a subsequent screen printing operation.

Yet another characteristic feature of the present method is that during said interconnection step portions are removed from said conductive layer.

In a preferred embodiment these portions are removed from said conductive layer by an etching technique similar to the one used to realize printed circuit boards.

As a result, the realized interconnection does not increase the thickness of the card and the conduction resistance introduced by the contact is very small.

The present invention also relates to a process for creating a conductive bump on a terminal pad of an integrated electronic component coated with a passivation layer.

In the presently available electronic components such as LSI chips the terminal pads are located in recesses of the passivation layer so that their interconnection with an above mentioned card by the above method or by the printed wiring connnection (PWC) is impossible.

Another object of the present invention is to provide a process for creating a conductive bump protruding from the passivation layer so that the above method according to the invention may be used for interconnecting the electronic component and a card.

According to the present invention this other object is achieved due to the fact that said process includes the steps of covering said passivation layer with a conductive protection layer, of covering said protection layer with a mask having a hole at a location corresponding to said terminal pad, of depositing a metal into said hole, of removing said mask, and of etching said protection layer so as to remove the portions thereof covering said passivation layer.

In this way, a conductive bump is created at the location of the terminal pad of the electonic component and protrudes from the passivation layer.

The above mentioned and other objects and features of the invention will become more apparent and the invention itself will be best understood by referring to the following description of an embodiment taken in conjuction with the accompanying drawings wherein:

FIGS 1 to 5 illustrate the successive steps of a process according to the invention for creating conductive bumps 2, 3, 4 on an electronic component 1 used in a method according to the invention; and FIGS. 6 to 9 illustrate the successive steps of this method.

The process and the method described hereinafter may be used to realize an Integrated Circuit (IC) card of the credit, debit or charge type generally called memory card when able to store variable data or intelligent (smart) card when including a microprocessor. In this last case (not shown) it also houses a number of electronic components such as a battery, a Random Access Memory (RAM), a Read-Only Memory (ROM) and/or other Large Scale Integrated (LSI) chips connected to terminals of a circuit printed on the card.

First, the process for causing electrically conductive bumps 2, 3, 4 on a chip 1 is described hereafter. In this connection it may be noted that in some circumstances these bumps only need to be heat conductive to ensure, for instance, a better fastening of the chip 1 to a card 5 by soldering.

FIG. 1 shows an LSI chip 1 having terminal pads 6, 7, 8 located in recesses or holes of a passivation layer 9 covering the upper surface of the chip 1. The passivation layer 9 is for instance a layer of silicon nitride and its goal is to protect the chip 1 against corrosion and other possible damages.

Figure 2:
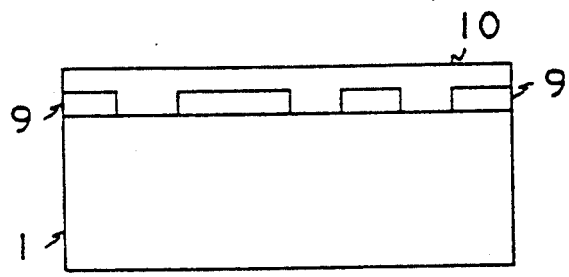

In a first process step illustrated by FIG. 2, a trimetal layer 10 is deposited over the passivation layer 9. This layer 10 is constituted by titanium, tungsten and gold. The process to apply such a trimetal layer 10 on a passivation layer 9 is for instance described in the article "STUDIES OF THE Ti-W/Au METALLIZATION ON ALUMINUM" by R. NOWICKI et al, published at the occasion of the "International Conference on Metallurical Coatings", San Francisco, Calif. U.S.A., Apr. 3-7, 1978, pages 195 to 205. This trimetal layer 10 has a thickness of about 2,000 Angström.

Figure 3:
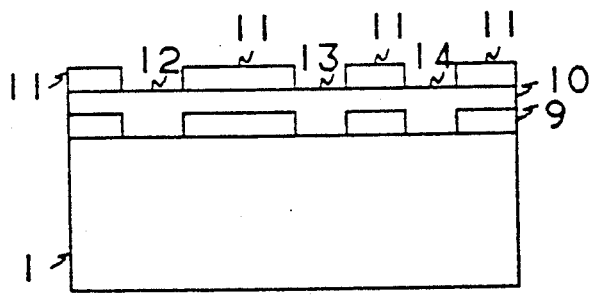

FIG. 3 illustrates a second step of the present process which consists in covering the trimetal layer 10 with a photolithographic mask 11. This photolithographic mask 11 is such that the trimetal layer 10 is accessible through holes 12, 13, 14 corresponding to the locations of the terminal pads 6, 7, 8 respectively.

Figure 4:
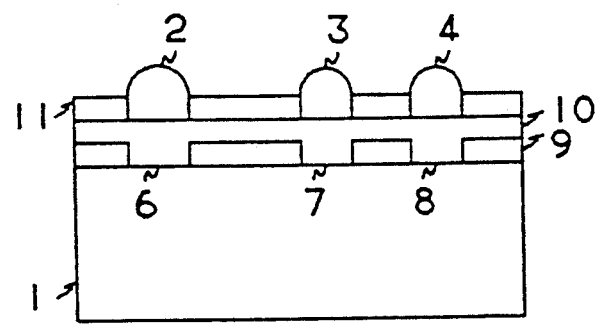

A third process step, illustrated by FIG. 4, consists in sputtering the holes 12, 13, 14 metallic material which is for instance gold or copper. Electrically conductive bumps 2, 3, 4 are created in this manner at the locations of the terminal pads 6, 7, 8 of the chip 1 respectively. These conductive bumps 2, 3, 4 have a height of about 25 to 30 microns.

Figure 5:
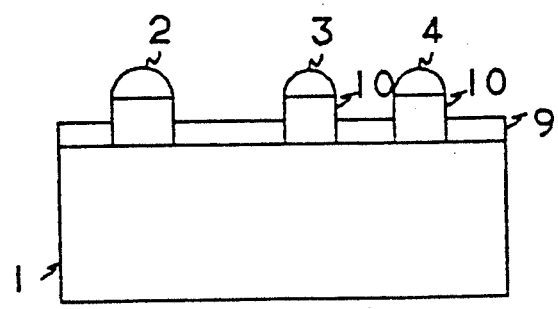

In a fourth process step illustrated by FIG. 5, first the photolithographic mask 11 is removed from the chip 1 and the latter is etched to remove the portions of the trimetal layer 10 covering the passivation layer 9. Because the thickness of the terminal layer 10 is much smaller than the height of the conductive bumps 2, 3, 4, the latter are only slightly affected by the metal etching process.

The method for mounting the LSI chip 1 thus obtained into a card 5 and for interconnecting them is described hereafter.

Figure 6:
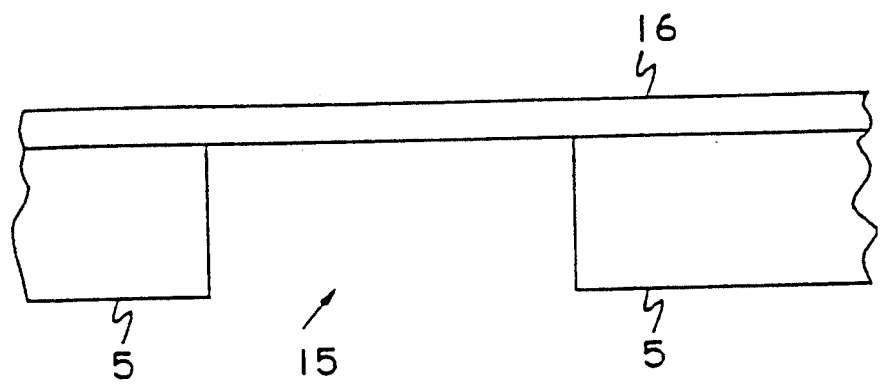

A first method step related to FIG. 6, consists in making one or more holes 15 in the card 5. The hole 15 is slightly larger than and has the same shape, e.g. rectangular, as the LSI chip 1 to be mounted therein.

During a second method step, the whole card 5 including the hole 15 is covered with a layer 16 of an electrically conductive material which is generally a metal such as copper or a metallic alloy such as brass.

Figure 7:
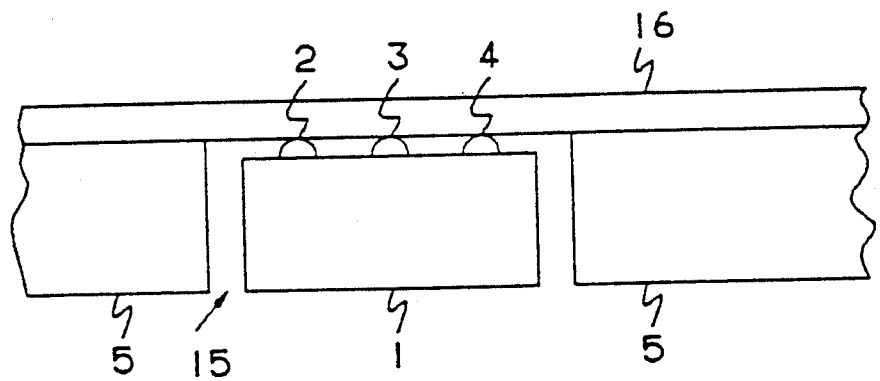
Figure 8:
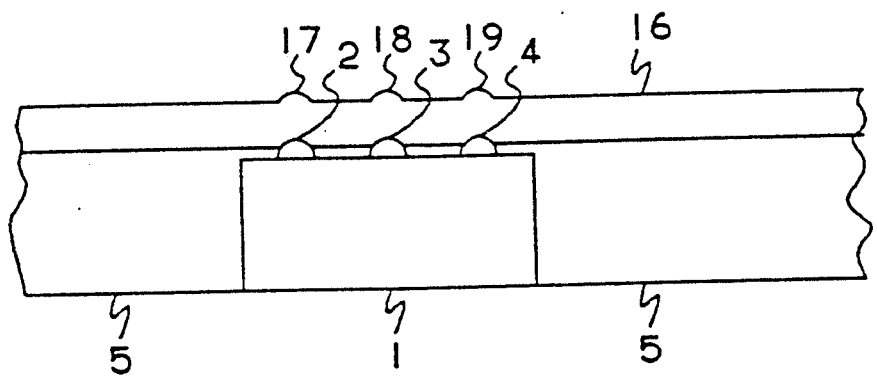

Then, in a third method step illustrated by FIG. 7, the chip 1 is mounted inside the hole 15 so that the conductive bumps 2, 3, 4 thereof make contact with the conductive layer 16 covering the hole 15. The chip 1 is therefore first mounted on a support which brings it into the hole 15 or, in a preferred embodiment (not shown), the card 5 is reversed and the chip 1 is handled by suction means which positions it into the hole 15.

In a fourth method step (not shown), an intimate electrical contact is ensured between the conductive bumps 2, 3, 4 and the conductive layer 16 by exerting pressure on the chip 1 towards the conductive layer 16 while heating either the chip 1, the conductive layer 16, or both so as to perform a contact soldering. In the preferred embodiment (not shown), a "thermode" is placed on the chip 1 to simultaneously create pressure and heating. By this operation the conductive bumps 2, 3, 4 create protrusions 17, 18, 19 on the upper surface of the conductive layer 16 respectively.

Prior to mounting the chip 1 in the hole 15, a layer of material (not shown) such as tin may be coated on the lower side of the portion of conductive layer 16 which covers this hole 15 in order to facilitate the soldering of the conductive bumps 2, 3, 4 to this layer 16.

In a fifth method step, the chip 1 is embedded in the hole 15 by filling it (not shown) with an embedding material such as epoxy. The embedding material has a viscosity which allows it to fill the interstices between the chip 1 and the layer 16. In this way, the upper side of the chip 1 is protected by the embedding material when portions of the layer 16 are removed by the etching step described below. It is to noted that the coefficient of expansion of the embedding material is chosen so that the card 5 is not mechanically affected by the heat dissipation of the operating chip 1. The bottom side of the card 5 is then laminated to obtain the planar structure shown in FIG. 8.

Figure 9:
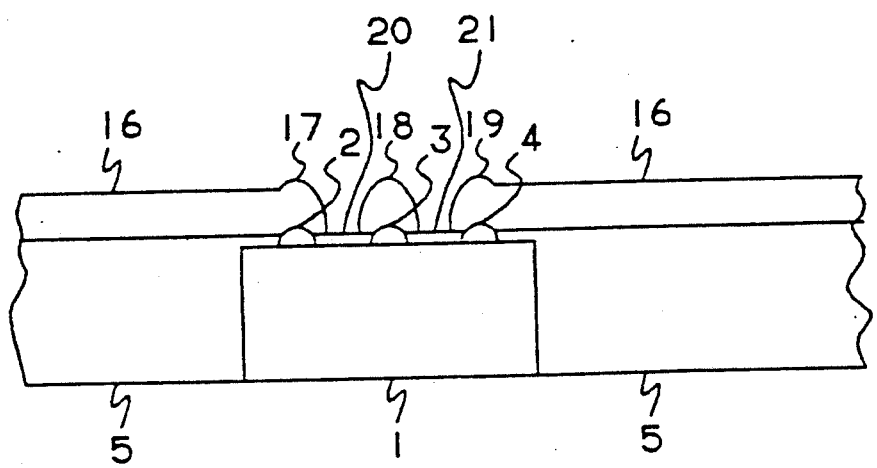

FIG. 9 relates to a sixth and last method step which consists in etching the conductive layer 16 to obtain a required circuit pattern on the upper surface of the smart card. The protrusions 17, 18, 19 on the upper surface of the conductive layer 16 thereby facilitate the alignment of the etching mask as they allow a visual localization of the conductive bumps 2, 3, 4 of the chip 1. Portions 20 and 21 can thus be removed from the electrically conductive layer 16 with high accuracy.

By using the present method, the width of the paths of the conductive layer 16 remaining after the portions 20, 21 have been removed, and thereby interconnecting the chip 1 and the card 5, is chosen as a function of the value of the current which has to flow therethrough or of the type of connection path required, e.g., a wide ground connection path as compared to a smaller signal connection path.

The smart card thus obtained may afterwards be coated with a layer of protective and/or strengthening material.

Because the position of the conductive layer 16 is fixed with respect to the upper surface of the chip 1, by using the present method the terminal pads 6, 7, 8 of the chip 1 need no longer be exclusively located at the periphery thereof as it is the case for instance when the wire bonding method is used. If in this case a terminal pad is not located at the periphery, the interconnecting wires then extend over the chip 1 and may be displaced, e.g. by vibrations, thereby causing short-circuits or at least constituting variable capacitances with this chip.

Another application of the present method is to create a heat dissipation element for the chip 1. Since the portion of the surface of the chip 1 which has the highest power dissipation can be determined, terminal pads of the same type as 6, 7, 8 may be created near this portion and connected to a portion of the layer 16 via heat conductive bumps of the same type as 2, 3, 4. This portion of the layer 16 may be chosen sufficiently large to operate as a heating dissipation element.

While the principles of the invention has been described above in connection with specific apparatus, it is to be clearly understood that this description is made only by way of example and not as a limitation on the scope of the invention.

What is claimed is:

1. Method for mounting an electronic component into a card and for interconnecting the component to the card, said electronic component being provided with at least one conductive bump constituting a terminal thereof, said method including the steps of creating at least one hole into said card, covering one end of said hole and at least that part of said card surrounding said hole by a layer of a conductive material, inserting said component into said hole of said card, pressing said electronic component and a portion of an adjacent one side of said conductive layer against each other and interconnecting said bump and said layer so that the said conductive bump forms a protrusion that is visible from the other side of said layer, using said protrusion to align an etching mask relative to said conductive bump, and using said etching mask in a subsequent etching operation to remove portions of said conductive layer while leaving said bump electrically interconnected to said layer.

2. Method according to claim 1, further comprising the step of soldering said conductive bump to said conductive layer by heating said conductive layer.

3. Method according to claim 1, further comprising the step of soldering said conductive bump to said conductive layer by heating said electronic component.

4. Method according to claim 1, further comprising the step of soldering said conductive bump to said conductive layer while pressing said electronic component and said conductive layer against each other.

5. A method according to claim 1, further comprising the steps of providing an intermediate metal between said conductive bump and said conductive layer, and soldering both said conductive bump and said conductive layer to said intermediate metal.

6. Method according to claim 1, wherein both said conductive bump and said conductive layer are heat conductive as well as electrically conductive.

7. Method according to claim 1, characterized in that said conductive layer is a metallic sheet.

* * * * *

UNITED STATES PATENT AND TRADEMARK OFFICE
CERTIFICATE OF CORRECTION

PATENT NO. : 5,042,145                          Page 1 of 2

DATED      : August 27,1991

INVENTOR(S) : Jan P. Boucquet

It is certified that error appears in the above-identified patent and that said Letters Patent is hereby corrected as shown below:

ON THE TITLE PAGE:

In the Abstract, line 9, change "ussed" to -- used --.

Column 1, lines 6-13, this section should be in conventional paragraph form.
Column 1, line 22, change "mehods" to -- methods --.
Column 1, line 24, after "method" change "an" to -- and --.
Column 1, line 34, after "cards of" change "hte" to -- the --.

Column 2, line 8, after "positive" insert -- position --.
Column 2, line 54, change "conjuction" to -- conjunction --.

Column 3, line 3, change "causing" to -- creating --.
Column 3, line 23, change "Metallurical" to -- Metallurgical --.

UNITED STATES PATENT AND TRADEMARK OFFICE
CERTIFICATE OF CORRECTION

PATENT NO. : 5,042,145
DATED : August 27, 1991
INVENTOR(S) : Jan P. Boucquet

It is certified that error appears in the above-identified patent and that said Letters Patent is hereby corrected as shown below:

Column 3, line 32, change "FIG, 4," to -- FIG. 4 --.
Column 3, line 33, after "sputtering" insert -- in --.
Column 3, line 43, change "terminal" to -- trimetal --.

Column 4, line 21, before "noted" insert -- be --.

Signed and Sealed this

Second Day of March, 1993

Attest:

STEPHEN G. KUNIN

Attesting Officer   Acting Commissioner of Patents and Trademarks